United States Patent
Seok

(10) Patent No.: US 9,042,143 B2
(45) Date of Patent: May 26, 2015

(54) LOW FORWARD VOLTAGE RECTIFIER USING CAPACITIVE CURRENT SPLITTING

(71) Applicant: IXYS Corporation, Milpitas, CA (US)

(72) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 139 days.

(21) Appl. No.: 13/900,451

(22) Filed: May 22, 2013

(65) Prior Publication Data

US 2013/0249529 A1    Sep. 26, 2013

Related U.S. Application Data

(63) Continuation-in-part of application No. 13/317,800, filed on Oct. 29, 2011, now Pat. No. 8,649,199.

(51) Int. Cl.

| G05F 1/46 | (2006.01) |
|---|---|
| H05K 13/00 | (2006.01) |
| H02M 3/335 | (2006.01) |
| H02M 1/08 | (2006.01) |
| H02M 1/00 | (2006.01) |
| H01L 27/06 | (2006.01) |

(52) U.S. Cl.
CPC *G05F 1/46* (2013.01); *H05K 13/00* (2013.01); *Y10T 29/49117* (2015.01); *Y02B 70/1491* (2013.01); *H02M 3/33576* (2013.01); *H02M 2001/0048* (2013.01); *H02M 1/083* (2013.01); *H01L 27/0664* (2013.01); *Y02B 70/1433* (2013.01)

(58) Field of Classification Search
CPC ............. H02M 3/33507; H02M 3/33523; H02M 3/33592; H02M 7/003; Y02B 70/1475

USPC .............. 363/21.12, 21.13, 21.14, 127, 147
See application file for complete search history.

(56) References Cited

U.S. PATENT DOCUMENTS

| 3,582,758 | A | * | 6/1971 | Gunn | 363/127 |
|---|---|---|---|---|---|
| 4,247,859 | A | * | 1/1981 | Rai-Choudhury et al. | 257/352 |
| 5,841,603 | A | * | 11/1998 | Ramalho et al. | 360/68 |
| 6,107,860 | A | * | 8/2000 | Vinciarelli | 327/427 |
| 6,430,071 | B1 | * | 8/2002 | Haneda | 363/127 |
| 6,678,180 | B2 | * | 1/2004 | Matsuda | 363/132 |
| 2009/0316441 | A1 | * | 12/2009 | Hu | 363/21.06 |
| 2012/0063175 | A1 | * | 3/2012 | Wang et al. | 363/21.14 |
| 2013/0127017 | A1 | * | 5/2013 | Seok | 257/577 |

* cited by examiner

*Primary Examiner* — Adolf Berhane
(74) *Attorney, Agent, or Firm* — Imperium Patent Works; Amir V. Adibi

(57) ABSTRACT

A Low Forward Voltage Rectifier (LFVR) circuit includes a bipolar transistor, a parallel diode, and a capacitive current splitting network. The LFVR circuit, when it is performing a rectifying function, conducts the forward current from a first node to a second node provided that the voltage from the first node to the second node is adequately positive. The capacitive current splitting network causes a portion of the forward current to be a base current of the bipolar transistor, thereby biasing the transistor so that the forward current experiences a low forward voltage drop across the transistor. The LFVR circuit sees use in as a rectifier in many different types of switching power converters, including in flyback, Cuk, SEPIC, boost, buck-boost, PFC, half-bridge resonant, and full-bridge resonant converters. Due to the low forward voltage drop across the LFVR, converter efficiency is improved.

24 Claims, 11 Drawing Sheets

LFVR WITH NPN BIPOLAR TRANSISTOR AND WITH CAPACITIVE CURRENT SPLITTING

CAPACITIVE CURRENT SPLITTING

LFVR WITH NPN BIPOLAR TRANSISTOR AND
WITH CAPACITIVE CURRENT SPLITTING

LFVR WITH PNP BIPOLAR TRANSISTOR AND
WITH CAPACITIVE CURRENT SPLITTING

CUK CONVERTER

SEPIC CONVERTER

BOOST CONVERTER

BOOST-TYPE POWER FACTOR CORRECTION (PFC) CONVERTER CIRCUIT

SERIES LOADED HALF-BRIDGE
RESONANT CONVERTER

PARALLEL LOADED FULL-BRIDGE PHASE SHIFT
RESONANT CONVERTER

BUCK-BOOST CONVERTER

LOW FORWARD VOLTAGE RECTIFIER USING CAPACITIVE CURRENT SPLITTING

CROSS-REFERENCE TO RELATED APPLICATION

This application is a continuation-in-part of, and claims the benefit under 35 U.S.C. §120 from, nonprovisional U.S. patent application Ser. No. 13/317,800, entitled "Low Forward Voltage Rectifier," filed on Oct. 29, 2011. This application expressly incorporates by reference the entire content of U.S. patent application Ser. No. 13/317,800.

TECHNICAL FIELD

The described embodiments relate to rectifiers in switching power converters.

BACKGROUND INFORMATION

In a switching power converter, a substantial amount of power is dissipated across the rectifier in the output stage of the converter. In an example in which a charging current is made to flow through a diode rectifier on its way to charging an output capacitor, a voltage drop occurs across the diode. The instantaneous power lost is the product of the instantaneous voltage drop across the diode multiplied by the instantaneous current flow through the diode. This instantaneous power loss, integrated over time, represents an amount of energy lost. The energy is said to be lost due to the conversion of electrical energy into heat. Reducing the amount of energy lost in the output rectifier of a switching power converter, as a percentage of the total amount of energy delivered to the load, is desired.

SUMMARY

A Low Forward Voltage Rectifier (LFVR) circuit includes a bipolar transistor, a parallel diode, and a capacitive current splitting network. In one example the bipolar transistor is an NPN transistor, and the current splitting network involves a first capacitor, a second capacitor, a first inductor, and a second inductor. The forward current flowing through the LFVR is received onto a first node of the LFVR circuit. Some of the incoming forward current flows through the first capacitor to the base of the bipolar transistor. A base current is provided to the bipolar transistor through this first capacitor. The rest of the incoming forward current flows through the second capacitor to the collector of the bipolar transistor. The combined currents flowing into the base and into the collector merge and flow out of the emitter to the second node of the LFVR circuit. The LFVR circuit, when it is performing a rectifying function, conducts a forward current from the first node to the second node provided that the voltage from the first node to the second node is adequately positive. The LFVR circuit also has a third node. A first inductor is coupled between the third node and the collector of the bipolar transistor. A second inductor is coupled between the third node and the base of the bipolar transistor. The term "between" as it is used here means between in the electrical sense.

In addition to the first embodiment involving an NPN bipolar transistor, a second embodiment of the LFVR circuit involves a PNP bipolar transistor rather than an NPN bipolar transistor. The emitter of the PNP bipolar transistor is coupled to the first node. A first capacitor is coupled between the base of the transistor and a second node. A second capacitor is coupled between the collector of the transistor and the second node. The parallel diode has an anode coupled to the emitter of the transistor and a cathode coupled to the collector of the transistor. A first inductor is coupled between the collector of the transistor and a third node. A second inductor is coupled between the base of the transistor and the third node. When the PNP LFVR circuit is performing its rectifying function, a forward current is conducted from the first node, through the bipolar transistor, and to the second node, provided that the voltage from the first node to the second node is adequately positive. A base current is drawn out of the base of the transistor so that the emitter-to-collector voltage across the PNP transistor is low if a forward current is flowing.

The LFVR circuit is usable as a rectifier in a switching power converter. In an example of a flyback converter power supply, pulses of current from the secondary winding of the main transformer pass through the rectifier and charge the output capacitor. During times when the pulses are charging the output capacitor, the forward voltage drop across the LFVR circuit is, on average, substantially less than 1.0 volts.

Both the NPN and the PNP embodiments of the LFVR circuit see widespread use as rectifiers in other switching power converter circuits such as, for example, in a Cuk converter, in a SEPIC converter, in a boost converter, in a buck-boost converter, in a power factor correction circuit, in a half-bridge resonant converter, and in a full-bridge resonant converter. In each case, forward conduction losses of the circuit's rectifier are reduced as compared to a realization of the switching power converter than uses a conventional diode for rectification.

In some examples, the bipolar transistor is a Reverse Bipolar Junction Transistor (RBJT) and the parallel diode is a distributed diode. The RBJT and the distributed diode are integrated together onto the same semiconductor die. The RBJT has a $V_{BE}$ reverse breakdown voltage of at least twenty volts.

Further details, embodiments, methods and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings.

Figure 1:
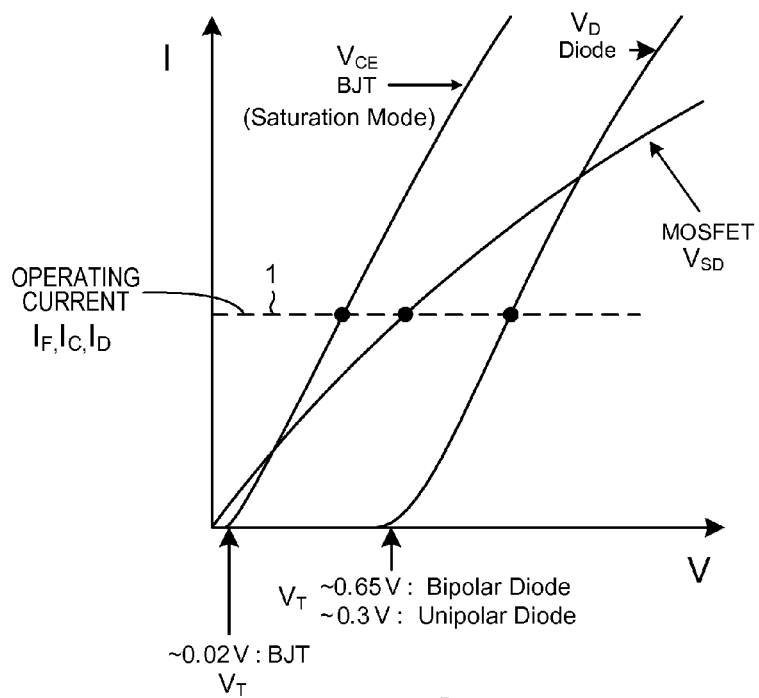
FIG. 1 is a diagram that shows the forward voltage voltage-to-current characteristics of a MOSFET, a diode, and a bipolar transistor.

FIG. 1 is a diagram that shows the forward voltage voltage-to-current characteristics of a metal oxide semiconductor field effect transistor (MOSFET), a diode, and a bipolar junction transistor (BJT). In the case of the diode, there is substantially no current flow through the diode for forward voltages less than a voltage $V_T$. In the case of a PN junction bipolar diode, this voltage $V_T$ at which a forward current starts to flow is about 0.65 volts. In the case of a unipolar diode (a Schottky diode), the voltage $V_T$ is about 0.3 volts. In the case of a bipolar transistor, a collector-to-emitter current begins to flow for forward voltages greater than a $V_T$ of about 0.02 volts, assuming that the bipolar transistor is supplied with an adequate amount of base current. In the case of a MOSFET having a high breakdown voltage, a source-to-drain current begins flowing at a zero voltage source-to-drain voltage, but at the same operating current the source-to-drain voltage drop across the MOSFET is larger than the collector-to-emitter voltage drop across the bipolar transistor at the same operating current. In FIG. 1, the operating current is represented by horizontal dashed line 1. In a switching power converter, a diode is usually used as the rectifier in the output stage. If a bipolar transistor could be used in the place of the diode rectifier, then the forward voltage drop across the rectifier could be reduced, thereby resulting in less power loss.

Figure 2:
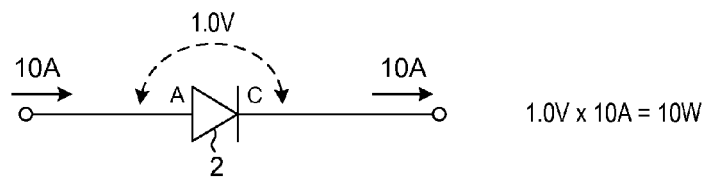
FIG. 2 is a diagram that illustrates the forward voltage drop across a diode rectifier.

FIG. 2 is a diagram that illustrates a diode rectifier 2. At an operating current flow of ten amperes, there is a one volt drop across the diode. This corresponds to a power loss of ten watts.

Figure 3:
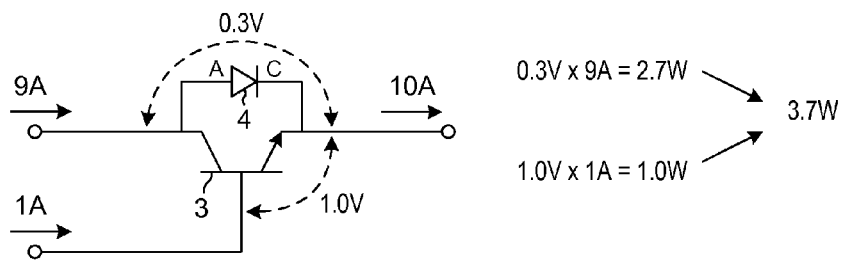
FIG. 3 is a diagram that illustrates the forward voltage drop across a bipolar transistor, having a parallel-connected diode.

FIG. 3 is a diagram that illustrates the forward voltage drop across a bipolar transistor 3, having a parallel-connected diode 4. Given an adequate current flow into the base, there is a 0.3 volt voltage drop between collector and emitter. Due to this low voltage, the voltage drop across the diode is less than the $V_T$ of the diode 4, and there is no forward current flow through the diode 4. For the same ten amperes of current flow considered with respect to the diode of FIG. 2, one ampere of this current is supplied to the base, and the remaining nine amperes is supplied to the collector. The one ampere base current undergoes a one volt voltage drop, so this current represents a one watt loss of power. The nine amperes of collector current undergo a 0.3 volt voltage drop, so this current represents a 2.7 watt loss of power. The overall loss of power is therefore 3.7 watts. The 3.7 watt loss of power with the bipolar transistor of FIG. 3 is substantially less than the ten watt loss of power with the ordinary rectifier diode of FIG. 2. Using the bipolar transistor as the rectifier in the output stage of the switching power converter is therefore desired.

Figure 4:
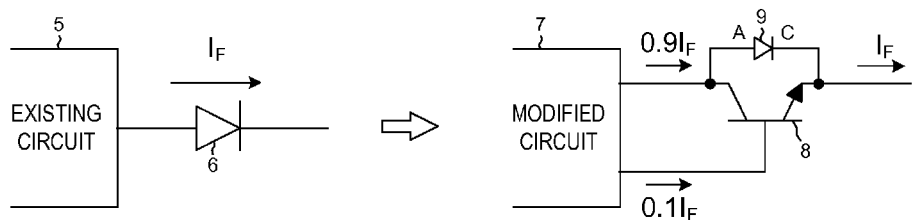
FIG. 4 is a diagram that illustrates how a rectifier diode in a switching power converter can be replaced with a bipolar transistor and parallel diode.

FIG. 4 is a diagram that illustrates a rectifier diode in such a switching power converter. A current coming out of an existing part 5 of the power supply flows through the rectifying diode 6. To replace the rectifier diode 6 with the low forward voltage bipolar transistor rectifier 8 and parallel diode 9, the circuitry 5 of the power supply is modified. The modified circuit 7 splits the current in a rough 9 to 1 ratio such that about one tenth of the overall current is supplied to the base of the bipolar transistor 8.

Figure 5:
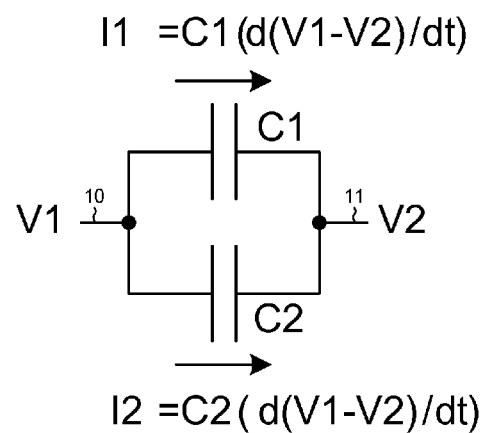
FIG. 5 is a diagram that illustrates capacitive current splitting.

FIG. 5 is a simplified diagram that illustrates the capacitive current splitting manner of splitting a current flow into a collector current and a base current. The circuit involves a first capacitor C1 and a second capacitor C2. In the circuit of FIG. 4, when the forward current is being conducted through the rectifier, the voltage on the collector is quite close to the voltage on the base. For conceptual purposes, the two voltages are the same, and therefore the two nodes are considered to operate as one node. The two left terminals of capacitors C1 and C2 are coupled together. Due to the collector voltage and the base voltage being roughly the same, the two right terminals of capacitors C1 and C2 are also coupled together. Accordingly, the ratio of current flow through the two capacitors is given by the ratio of their capacitances, for a voltage V1-V2 between the two nodes 10 and 11. This capacitive current splitting is employed to drive the bipolar transistor of the LFVR circuit in the switching power converter.

Figure 6:
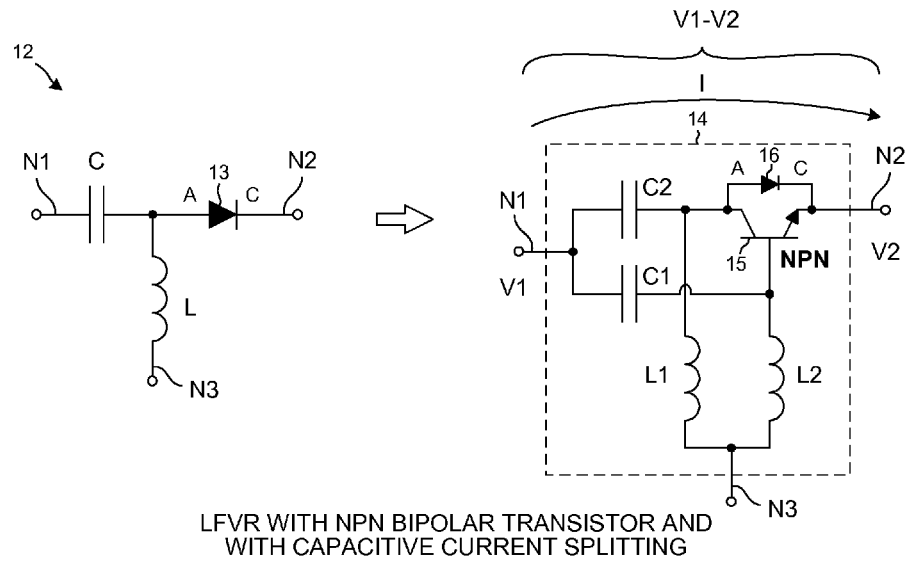
FIG. 6 is a diagram that illustrates how a rectifier diode circuit can be replaced with a first embodiment of a low forward voltage rectifier (LFVR) circuit.

FIG. 6 illustrates a first circuit 12 on the left. This first circuit 12 involves a rectifier diode 13. This first circuit 13, if found in a switching power converter, can be replaced with the first low forward voltage rectifier (LFVR) circuit 14 shown to the right in FIG. 6. The first LFVR circuit 14 involves an NPN bipolar transistor 15, a parallel diode 16, two capacitors C1 and C2, and two inductors L1 and L2. Node N3 is a node that carries a substantially constant DC voltage or ground potential.

Figure 7:
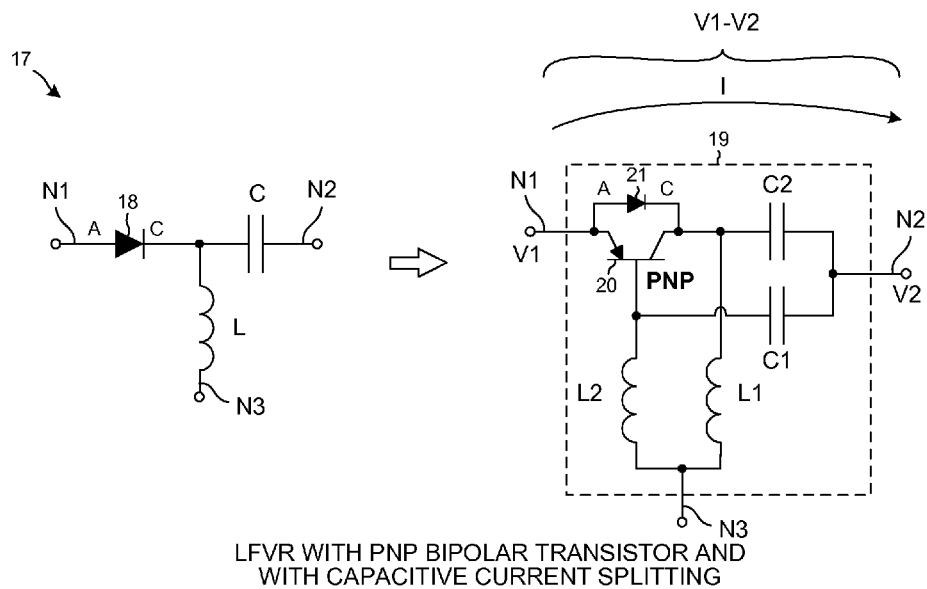
FIG. 7 is a diagram that illustrates how a rectifier diode circuit can be replaced with a second embodiment of a low forward voltage rectifier (LFVR) circuit.

FIG. 7 illustrates a second circuit 17 on the left. This second circuit 17 involves a rectifier diode 18. This second circuit 17, if found in a switching power converter, can be replaced with the second LFVR circuit 19 shown to the right in FIG. 7. The second LFVR circuit 19 involves a PNP bipolar transistor 20, a parallel diode 21, two capacitors C1 and C2, and two inductors L1 and L2. Node N3 is a node that carries a substantially constant DC voltage or ground potential.

Although the ends of the inductors L1 and L2 opposite the transistor are coupled together at node N3 in the examples of FIG. 6 and FIG. 7, these ends of the inductors L1 and L2 are not connected together in all embodiments. For example, in some circuits these ends of the inductors L1 and L2 are coupled to two different nodes at two different DC voltages. In a typical example, the capacitance of capacitor C2 is at least ten times greater than the capacitance of capacitor C1.

Figure 8:
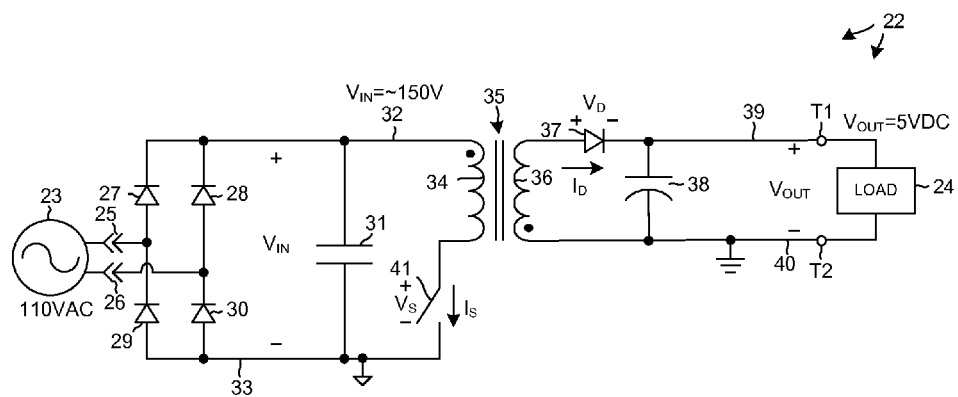
FIG. 8 is a diagram of a flyback switching power converter power supply.
Figure 9:
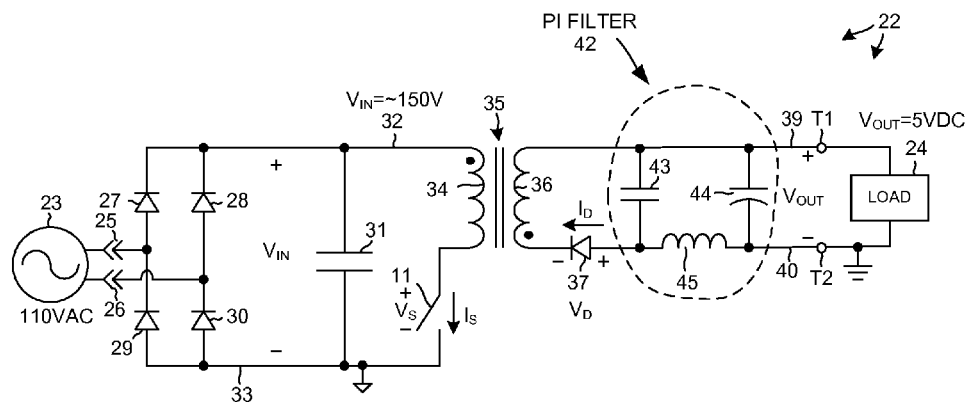
FIG. 9 is a diagram that illustrates how the output capacitor of the flyback power supply of FIG. 8 can be replaced with a pi filter.
Figure 10:
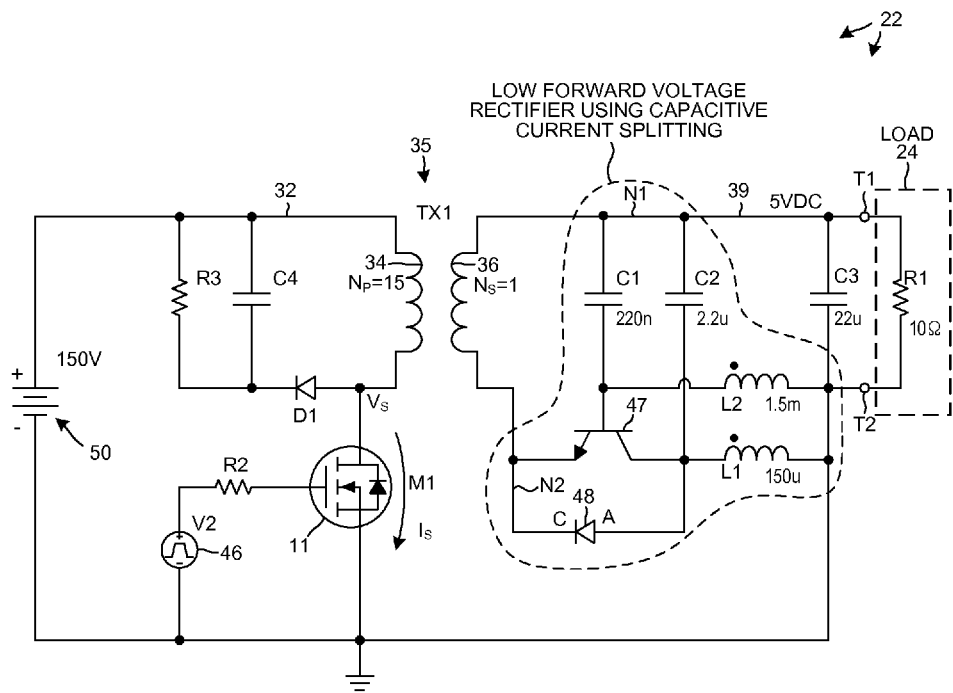
FIG. 10 is a diagram that illustrates how rectifier circuitry in the modified circuit of FIG. 9 can be replaced with a low forward voltage rectifier that uses capacitive current splitting.

FIGS. 8, 9 and 10 are a sequence of diagrams that illustrates how the first LFVR circuit 14 of FIG. 6 is incorporated into an example of a switching power converter circuit. In this example, the switching power converter circuit is a flyback isolated DC-DC converter 22.

FIG. 8 is a diagram of the flyback isolated DC-DC converter 22. The converter converts 110 VAC from a voltage source 23 into 5 VDC. The 5 VDC is provided onto output terminals T1 and T2. The 110 VAC source, and the load 24, are not parts of the actual switching power converter. Reference numerals 25 and 26 represent a connector and terminals by which the switching power converter is coupled to the AC voltage source 23. A bridge rectifier involving diodes 27, 28, 29 and 30 full wave rectifies an 110 VAC signal such that 150 volts is present across input capacitor 31 between a VIN node and conductor 32 and a ground node and conductor 33. A switch 41 is opened and closed as is known in the art such that pulses of current are drawn from node 32 and through the primary winding 34 of a transformer 35. Stopping current flow in the primary winding results in a pulse of current flowing up through the secondary winding 36, and through the rectifier diode 37, to charge output capacitor 38. The turns ratio of the transformer 35 is such that the output capacitor 38 is charged to 5 VDC. The 5 VDC is present between output supply node and conductor 39 and ground node and conductor 40. The load 24 draws power through terminals T1 and T2.

FIG. 9 shows a modification that can be made to the converter 22 of FIG. 8. The output capacitor 38 of the converter is replaced with a pi filter 42. The pi filter 42 includes a first capacitor 43, a second capacitor 44, and an inductor 45. How to carry out a pi filter substitution for a capacitor is known in the art. In addition to the pi filter substitution, the rectifier diode 37 of FIG. 8 is moved to the position indicated in FIG. 9.

FIG. 10 shows how circuitry of the modified circuit of FIG. 9 is replaced with the first LFVR circuit 14 of FIG. 6. The illustration of FIG. 10 is a simplification. The AC voltage source, full wave rectifier, and input capacitor are represented in FIG. 10 by the 150 VDC voltage source symbol 50. The control and switch driving circuitry of the flyback converter is represented by a signal source symbol V2 46, and no output voltage monitoring circuitry is shown. There are many known ways to control and to monitor a flyback converter. How the flyback switching power supply is controlled and monitored is well known in the art and is not described here.

The primary output rectifier of the flyback converter is not the diode 37 of FIG. 8 as is conventional, but rather is the first LFVR circuit 14 of FIG. 6 that uses capacitive current splitting. The proportion of the rectifier forward current that is supplied to the collector of the bipolar transistor 47 via capacitor C2 as compared to amount of rectifier forward current that is supplied to the base of the bipolar transistor via capacitor C1 is determined by the relative capacitances of C1 and C2. This proportion changes somewhat throughout the time period that the forward voltage is flowing for various reasons, but the proportion is roughly fixed and is set by the C1 and C2 values.

When the secondary current first starts flowing out of the secondary winding 36 and to node 39, the bipolar transistor 47 may not start conducting and working as a rectifier instantaneously. The parallel diode 48 is provided to perform the rectification function during this time. Also later, when the secondary current stops flowing, the base current to the bipolar transistor 47 may be cut off before the collector current stops flowing. The bipolar transistor 47 may therefore be turned off too fast. The parallel diode 48 also may perform rectification during this time. Whether and how the parallel diode 48 performs rectification at the beginning of secondary current flow and at the ending of secondary current flow depends on details of the particular converter and how it is operating. The parallel diode 48 can be provided, and the operation of the converter monitored. The parallel diode 48 can then be removed, and the operation of the converter monitored. Operation of the converter with the parallel diode is compared to operation of the converter without the parallel diode. If circuit operation with the parallel diode removed is adequate, then the parallel diode is not required.

Figure 11:
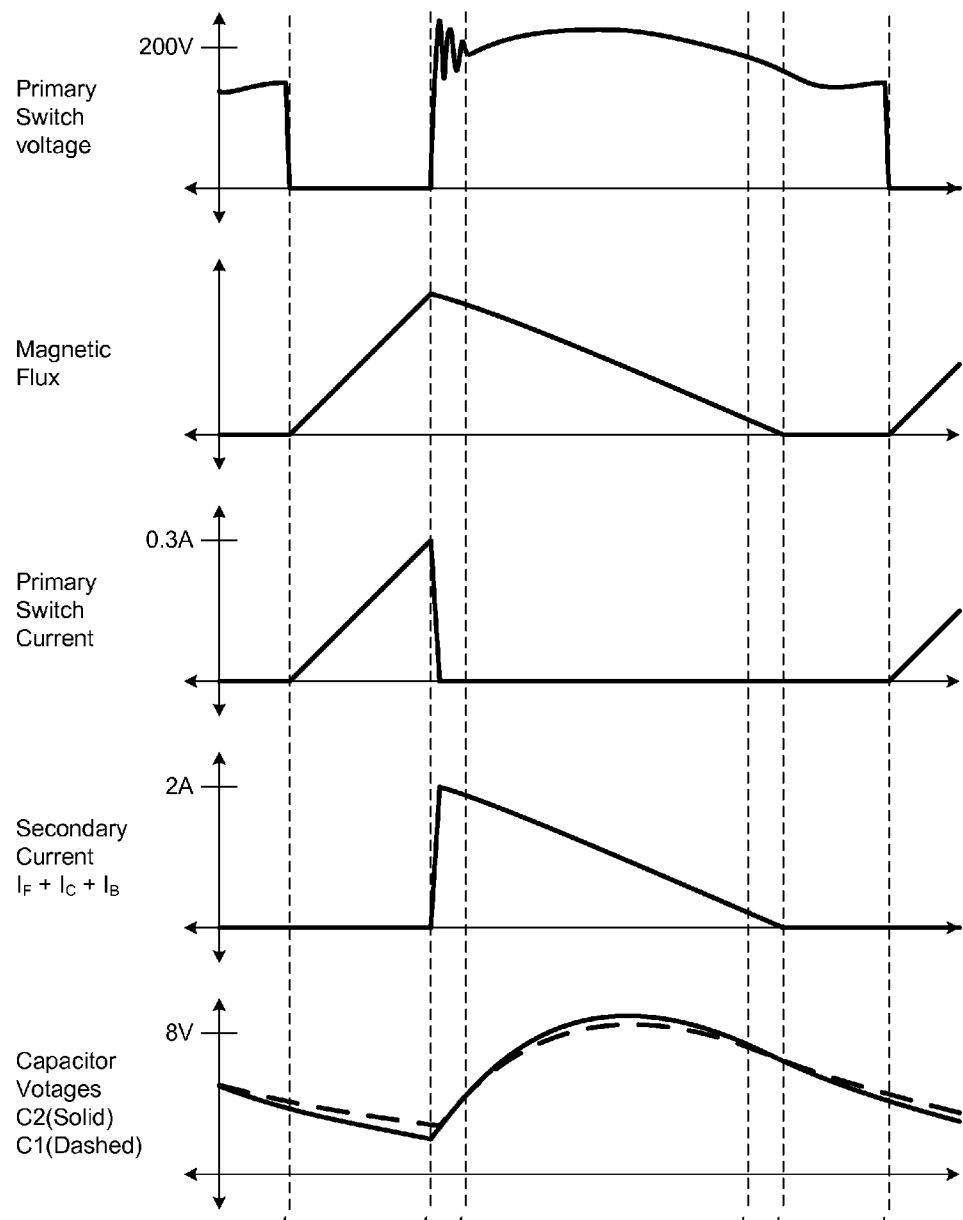
FIG. 11 is a waveform diagram that illustrates voltages and currents present in the switching power converter of FIG. 10.
Figure 12:
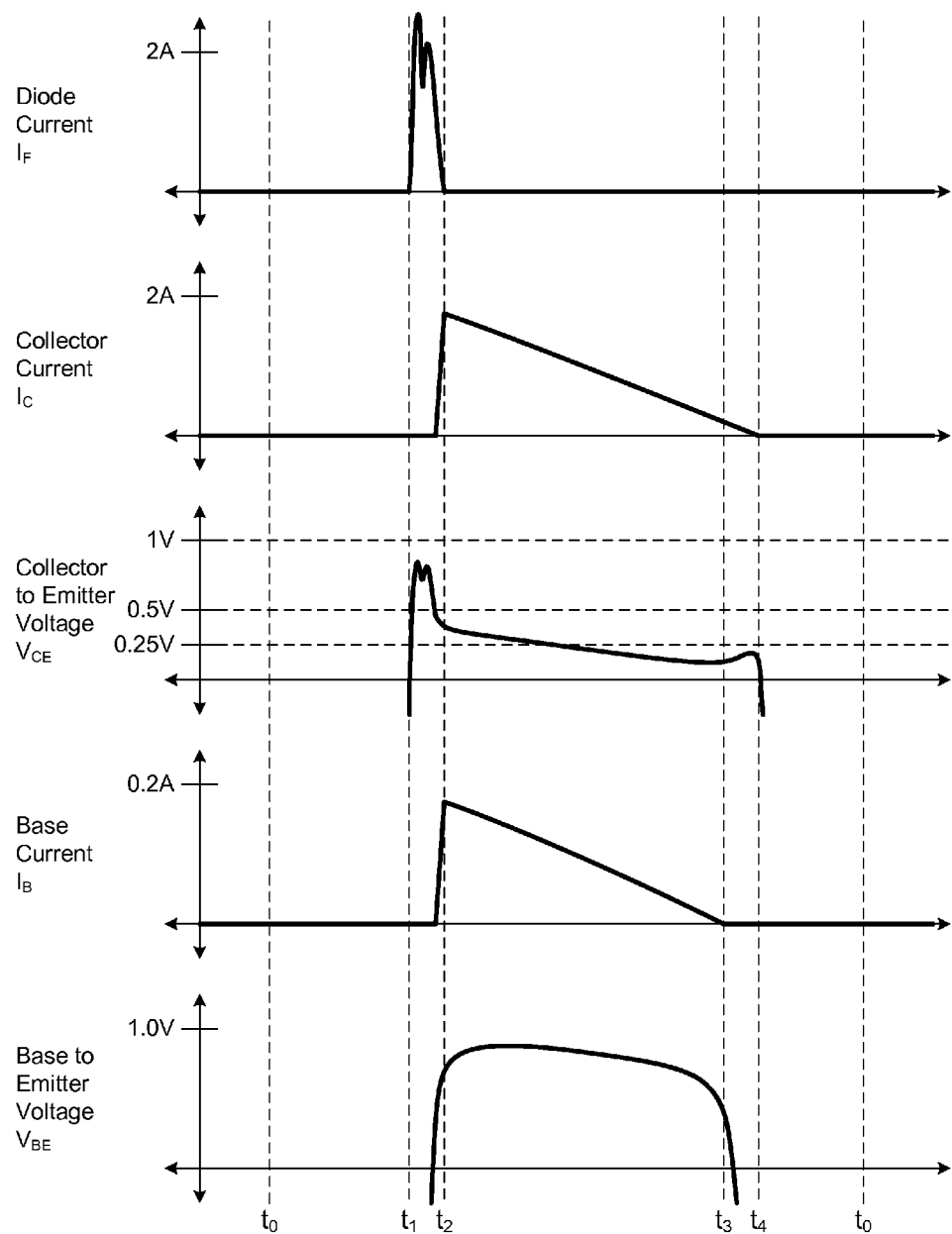
FIG. 12 is a waveform diagram that illustrates voltages and currents present in the switching power converter of FIG. 10.

FIG. 11 is a waveform diagram that illustrates voltages and current present in the flyback converter of FIG. 10 as the power supply operates. Additional waveforms are shown in FIG. 12. As seen in the waveform of FIG. 12 labeled "collector to emitter voltage", the voltage across the bipolar transistor between collector and emitter is substantially less than 1.0 volt for most of the time t2 to t3 when the rectifier is conducting a forward current. In the illustrated example, as indicated by the waveform "diode current", the parallel diode 48 only conducts during the initial time when secondary current starts flowing between t1 and t2. In this particular example, the parallel diode 48 does not conduct at the end of the cycle when the secondary current stops flowing.

In FIG. 12 in the "collector to emitter voltage" waveform and in the "base to emitter voltage" waveform, the voltages before time t1 and the voltages after time t4 is about −25 volts. Because this low voltage is off the scale of the diagram, the low voltages during these times are not seen in FIG. 12.

Although an example of a switching power converter is set forth above where the first LFVR circuit 14 involving capacitive current splitting has an NPN transistor, the second LFVR circuit 19 involving capacitive current splitting having a PNP transistor may also be employed. The NPN and PNP circuits are not limited to use in flyback switching power converter circuits, but rather are generally usable in other switching power converter circuits.

Figure 13:
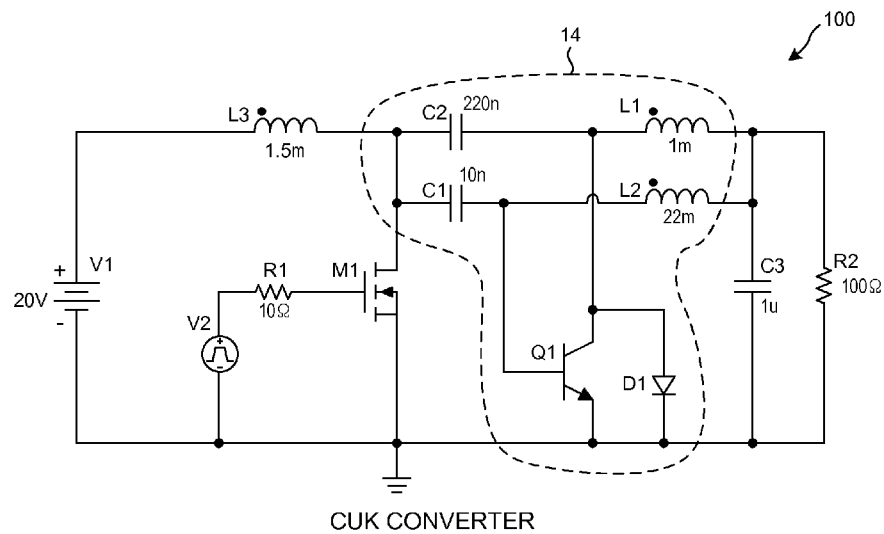
FIG. 13 is a diagram of a Cuk converter that employs an LFVR circuit having capacitive current splitting.

FIG. 13 is a simplified diagram of another type of switching power converter circuit, a Cuk converter 100. Cuk converter 100 includes an instance of the LFVR circuit 14 that has capacitive current splitting. Resistor R2 represents the load. C3 is the output capacitor. V1 represents a DC voltage source which can be the combination of an AC voltage source, a rectifier bridge, and an input capacitor. The V2 symbol represents the control circuit that drives the switch M1.

Figure 14:
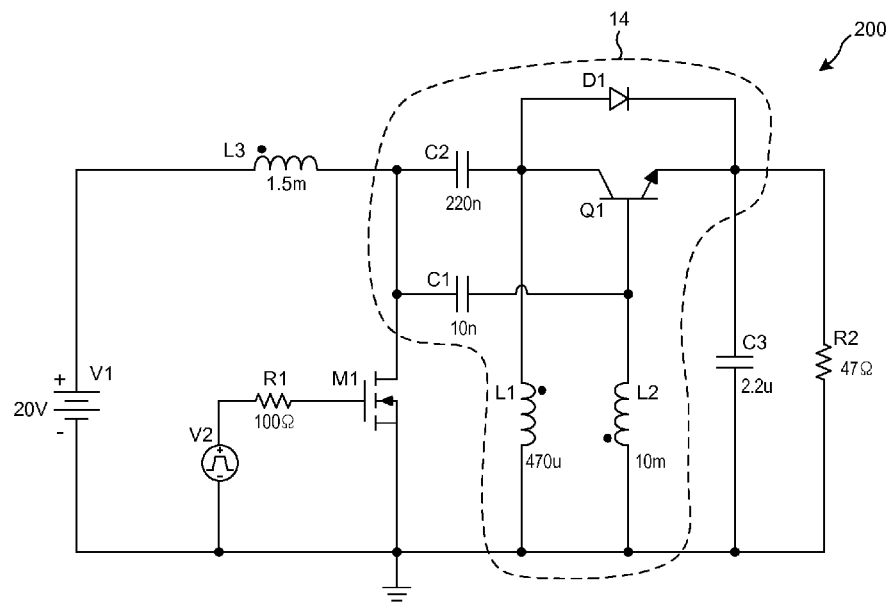
FIG. 14 is a diagram of a SEPIC converter that employs an LFVR circuit having capacitive current splitting.

FIG. 14 is a simplified diagram of another type of switching power converter circuit, a SEPIC converter 200. SPIC converter 200 includes an instance of the LFVR circuit 14 that has capacitive current splitting. Resistor R2 represents the load. C3 is the output capacitor. V1 represents a DC voltage source which can be the combination of an AC voltage source, a rectifier bridge, and an input capacitor. The V2 symbol represents the control circuit that drives the switch M1.

Figure 15:
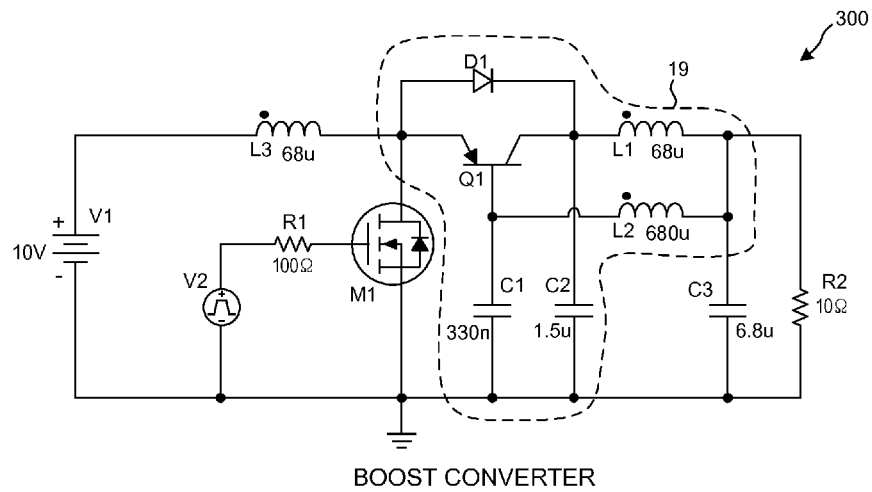
FIG. 15 is a diagram of a boost converter that employs an LFVR circuit having capacitive current splitting.

FIG. 15 is a simplified diagram of another type of switching power converter circuit, a boost converter 300. This circuit can be used for power factor correction. Boost converter 300 includes an instance of the LFVR circuit 19 that has capacitive current splitting. Resistor R2 represents the load. C3 is the output capacitor. V1 represents a DC voltage source which can be the combination of an AC voltage source, a rectifier bridge, and an input capacitor. The V2 symbol represents the control circuit that drives the switch M1.

Figure 16:
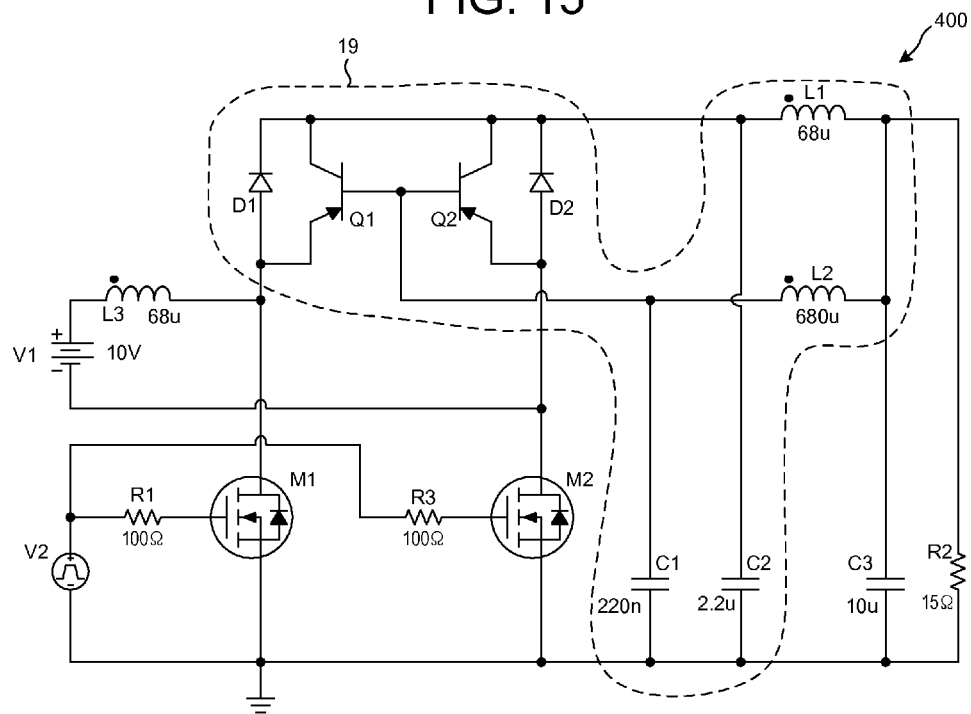
FIG. 16 is a diagram of a boost-type power factor correction (PFC) converter circuit that employs an LFVR circuit having capacitive current splitting.

FIG. 16 is a simplified diagram of another type of switching power converter circuit, a boost-type power factor correction (PFC) circuit 400 which does not have rectifying bridge diodes. PFC circuit 400 includes an instance of the LFVR circuit 19 that has two PNP transistors and parallel diodes, as well as a capacitive current splitting network. Resistor R2 represents the load. C3 is the output capacitor. V1 a DC voltage source which can be the combination of an AC voltage source, a rectifier bridge, and an input capacitor. The V2 symbol represents the control circuit that drives the switches M1 and M2.

Figure 17:
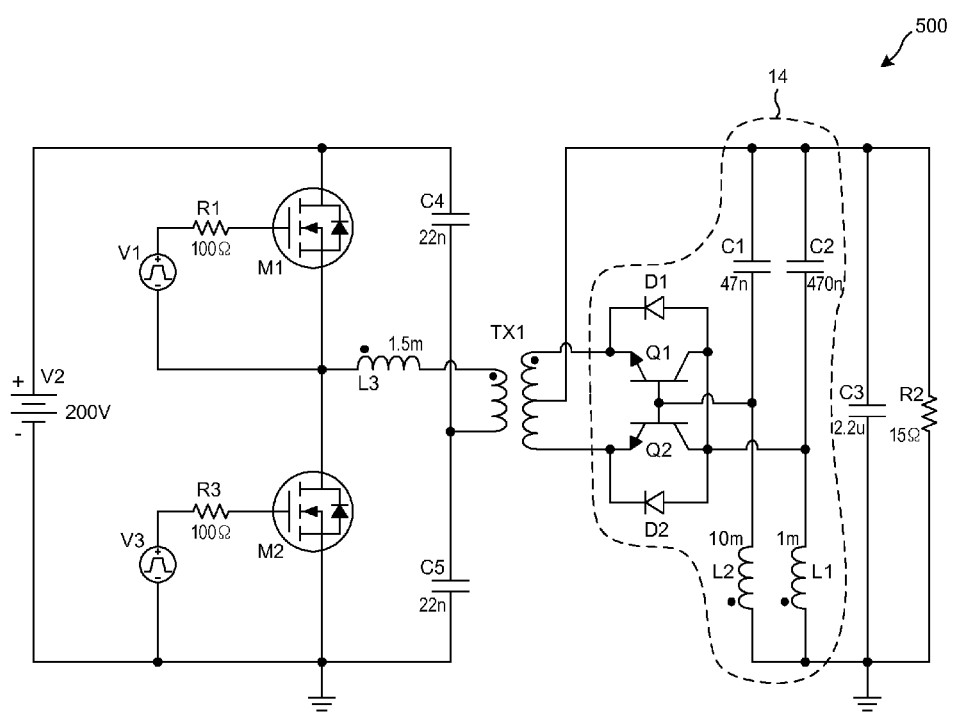
FIG. 17 is a diagram of a half-bridge series loaded resonant converter that employs an LFVR circuit having capacitive current splitting.

FIG. 17 is a simplified diagram of another type of switching power converter circuit, a half-bridge series loaded resonant converter 500. Converter 500 includes an instance of the LFVR circuit 14 that has two NPN transistors and parallel diodes, as well as a capacitive current splitting network. Resistor R2 represents the load. C3 is the output capacitor. V2 represents a DC voltage source which can be the combination of an AC voltage source, a rectifier bridge, and an input capacitor. The V1 symbol represents the control circuit that drives switch M1. The V3 symbol represents the control circuit that drives switch M2.

Figure 18:
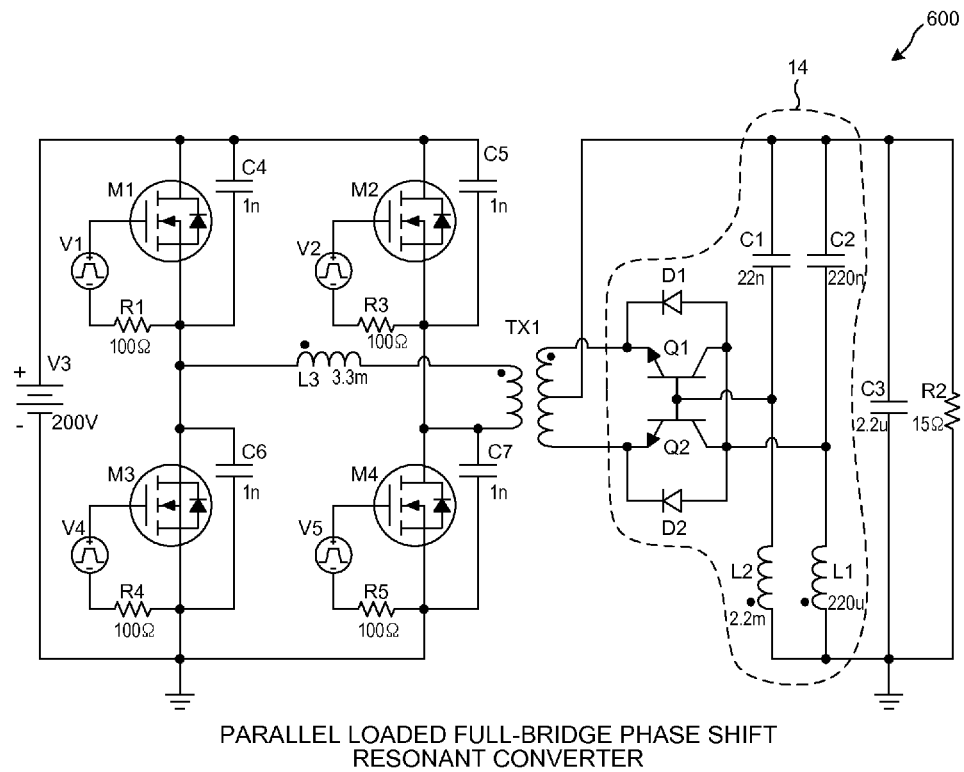
FIG. 18 is a diagram of a full-bridge phase shift parallel loaded resonant converter that employs an LFVR circuit having capacitive current splitting.

FIG. 18 is a simplified diagram of another type of switching power converter circuit, a full-bridge phase shift parallel loaded resonant converter 600. Converter 600 includes an instance of the LFVR circuit 14 that has two NPN transistors and parallel diodes, as well as a capacitive current splitting network. Resistor R2 represents the load. C3 is the output capacitor. V3 represents the AC voltage source, the rectifier bridge, and the input capacitor. The V1, V2, V4 and V5 symbols represent control circuits that drive the switches M1, M2, M3 and M4, respectively.

Figure 19:
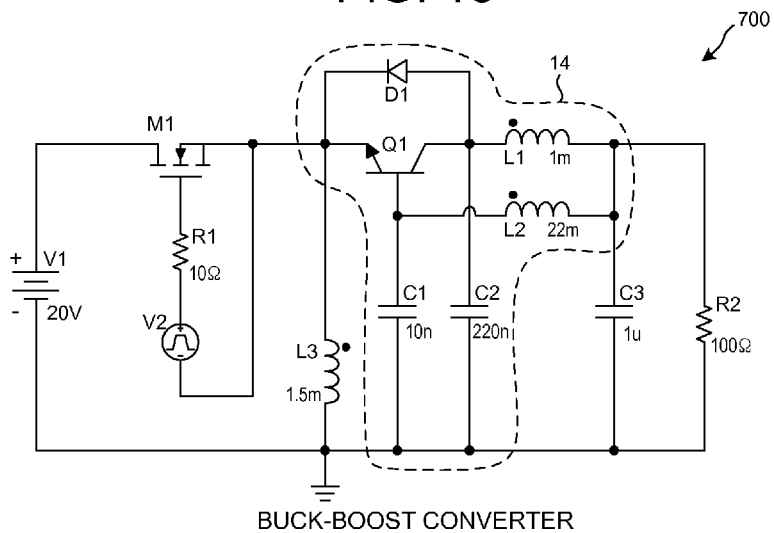
FIG. 19 is a diagram of a buck-boost converter that employs an LFVR circuit having capacitive current splitting.

FIG. 19 is a simplified diagram of another type of switching power converter circuit, a buck-boost converter 700. Converter 700 includes an instance of the LFVR circuit 14 that has an NPN transistor, as well as a capacitive current splitting network. Resistor R2 represents the load. C3 is the output capacitor. V1 represents a DC voltage source which can be the combination of an AC voltage source, a rectifier bridge, and an input capacitor. The V2 symbol represents the control circuit that drives the switch M1.

In some examples, the bipolar transistor of the LFVR circuit is a Reverse Bipolar Junction Transistor (RBJT) and the parallel diode is a distributed diode. The RBJT and the distributed diode are integrated together onto the same semiconductor die. The RBJT has a $V_{BE}$ reverse breakdown voltage of at least twenty volts. For further details on one example of an integrated version of the bipolar transistor and the parallel diode, see: U.S. patent application Ser. No. 13/317,800, entitled "Low Forward Voltage Rectifier", filed Oct. 29, 2011 (the entire subject matter of which is incorporated herein by reference).

A method of manufacture involves attaching (for example, by soldering) a first capacitor, a second capacitor, a bipolar transistor, a parallel diode, a first inductor, and a second inductor to a substrate (for example, a printed circuit board or direct metal bonded substrate) so as to realize the LFVR circuit 14 of FIG. 6 or the LFVR circuit 19 of FIG. 7. In this way the components are provided on the substrate as part of a switching power converter circuit.

In another method of manufacture, a LFVR circuit is provided in a three-terminal package. The components of the LFVR circuit are disposed on a substrate, and an amount of encapsulant is made to overmold the components to form a package body. The three package terminals (for nodes N1, N2 and N3) extend from the package body. Either the LFVR circuit 14 of FIG. 6 or the LFVR circuit 19 of FIG. 7 can be provided in an easy-to-use three-terminal package in this way.

Although certain specific embodiments are described above for instructional purposes, the teachings of this patent document have general applicability and are not limited to the specific embodiments described above. An LFVR circuit utilizing capacitive current splitting is not limited to use in power electronics, but rather sees general applicability. For example, where a capacitor is to be charged by current flow through a rectifying diode, the LFVR circuit can be applied by performing the pi filter substitution for the capacitor, and by placing the diode as appropriate for the type of LFRV circuit to be employed, and then by substituting the LFVR circuit for the diode and components of the pi filter as explained above in the example of FIGS. 8-10. Accordingly, various modifications, adaptations, and combinations of various features of the described embodiments can be practiced without departing from the scope of the invention as set forth in the claims.

What is claimed is:

1. A switching power converter circuit comprising:
   a first capacitor having a first terminal and a second terminal;
   a second capacitor having a first terminal and a second terminal, wherein the first terminal of the second capacitor is coupled to the first terminal of the first capacitor at a first node;
   a bipolar transistor having a base, a collector, and an emitter, wherein the collector is coupled to the second terminal of the second capacitor, and wherein the base is coupled to the second terminal of the first capacitor;
   a diode having an anode and a cathode, wherein the anode is coupled to the collector of the bipolar transistor, and wherein the cathode is coupled to the emitter of the bipolar transistor at a second node;
   a first inductor having a first terminal and a second terminal, wherein the first terminal of the first inductor is coupled to the collector of the bipolar transistor; and
   a second inductor having a first terminal and a second terminal, wherein the first terminal of the second inductor is coupled to the base of the bipolar transistor, and wherein the second terminal of the second inductor is coupled to the second terminal of the first inductor at a third node.

2. The switching power converter circuit of claim 1, wherein the first capacitor has a capacitance that is substantially smaller than a capacitance of the second capacitor.

3. The switching power converter circuit of claim 1, wherein the first inductor has an inductance that is substantially smaller than an inductance of the second inductor.

4. The switching power converter circuit of claim 1, further comprising:
   an output capacitor having a first terminal and a second terminal, wherein the first terminal of the output capacitor is coupled to the first terminals of the first and second capacitors at the first node.

5. The switching power converter circuit of claim 1, further comprising:
   an output capacitor having a first terminal and a second terminal, wherein the second terminal of the output capacitor is coupled to the second terminals of the first and second inductors at the third node.

6. The switching power converter circuit of claim 1, further comprising:
   a transformer winding coupled between the emitter of the bipolar transistor and the first terminals of the first and second capacitors.

7. The switching power converter circuit of claim 1, further comprising:
   a switch having a first terminal, a second terminal, and a third terminal, wherein the first terminal of the switch is coupled to the first terminals of the first and second capacitors, and wherein the second terminal of the switch is coupled to the emitter of the bipolar transistor.

8. The switching power converter circuit of claim 1, further comprising:
   a switch having a first terminal, a second terminal, and a third terminal, wherein the first terminal of the switch is coupled to the first terminals of the first and second capacitors, and wherein the second terminal of the switch is coupled to the second terminals of the first and second inductors.

9. The switching power converter circuit of claim 1, further comprising:
an output capacitor having a first terminal and a second terminal, wherein the first terminal of the output capacitor is coupled to the emitter of the bipolar transistor, and wherein the second terminal of the output capacitor is coupled to the second terminals of the first and second inductors.

10. The switching power converter circuit of claim 1, wherein the bipolar transistor is a Reverse Bipolar Junction Transistor (RBJT).

11. The switching power converter circuit of claim 1, wherein the diode is a distributed diode.

12. The switching power converter circuit of claim 1, wherein the bipolar transistor and the diode are integrated onto a semiconductor die.

13. The switching power converter circuit of claim 1, wherein the bipolar transistor has a reverse breakdown voltage of at least twenty volts.

14. A switching power converter circuit comprising:
a first capacitor having a first terminal and a second terminal;
a second capacitor having a first terminal and a second terminal, wherein the first terminal of the second capacitor is coupled to the first terminal of the first capacitor at a first node;
a bipolar transistor having a base, a collector, and an emitter, wherein the collector is coupled to the second terminal of the second capacitor, and wherein the base is coupled to the second terminal of the first capacitor;
a diode having an anode and a cathode, wherein the anode is coupled to the collector of the bipolar transistor, and wherein the cathode is coupled to the emitter of the bipolar transistor at a second node;
a first inductor having a first terminal and a second terminal, wherein the first terminal of the first inductor is coupled to the collector of the bipolar transistor; and
a second inductor having a first terminal and a second terminal, wherein the first terminal of the second inductor is coupled to the base of the bipolar transistor, wherein the second terminal of the second inductor is coupled to the second terminal of the first inductor at a third node, and wherein the switching power converter circuit is taken from the group consisting of: a flyback converter, a Cuk converter, a SEPIC converter, a boost converter, a buck-boost converter, a power factor correction circuit, a half-bridge resonant converter, and a full-bridge resonant converter.

15. A switching power converter circuit comprising:
a first capacitor having a first terminal and a second terminal;
a second capacitor having a first terminal and a second terminal;
a bipolar transistor having a base, a collector, and an emitter, wherein the collector is coupled to the second terminal of the second capacitor, and wherein the base is coupled to the second terminal of the first capacitor;
a diode having an anode and a cathode, wherein the anode is coupled to the collector of the bipolar transistor, and wherein the cathode is coupled to the emitter of the bipolar transistor;

a first inductor having a first terminal and a second terminal, wherein the first terminal is coupled to the collector of the bipolar transistor; and
a second inductor having a first terminal and a second terminal, wherein the first terminal is coupled to the base of the bipolar transistor, and wherein the switching power converter circuit is taken from the group consisting of: a flyback converter, a Cuk converter, a SEPIC converter, a boost converter, a buck-boost converter, a power factor correction converter circuit, a half-bridge resonant converter, and a full-bridge resonant converter.

16. A method of manufacture comprising:
(a) providing a first capacitor, a second capacitor, a bipolar transistor and a diode, such that the first capacitor is electrically coupled between a first node and a base of the bipolar transistor, such that the second capacitor is electrically coupled between the first node and a collector of the bipolar transistor, such that an anode of the diode is coupled to the collector of the bipolar transistor, and such that a cathode of the diode is coupled to an emitter of the bipolar transistor at a second node, wherein the first capacitor, second capacitor, bipolar transistor, and diode are parts of a switching power converter circuit;
(b) providing a first inductor such that the first inductor is electrically coupled between the collector of the bipolar transistor and a third node; and
(c) providing a second inductor such that the second inductor is electrically coupled between the base of the bipolar transistor and the third node.

17. The method of manufacture of claim 16, wherein (a), (b) and (c) involve attaching the first capacitor, the second capacitor, the bipolar transistor, the diode, the first inductor, and the second inductor to a substrate.

18. The method of manufacture of claim 16, wherein the first capacitor has a capacitance that is substantially smaller than a capacitance of the second capacitor.

19. The method of manufacture of claim 16, wherein the first inductor has an inductance that is substantially smaller than an inductance of the second inductor.

20. A switching power converter circuit comprising:
a bipolar transistor having a base, a collector, and an emitter; and
means for receiving a current from a first node and for capacitively splitting the current so that a first portion of the current is supplied by the means to the base of the bipolar transistor and so that a second portion of the current is supplied by the means to the collector of the bipolar transistor, wherein the means comprises: a first inductor coupled to the collector of the bipolar transistor, and a second inductor coupled to the base of the bipolar transistor.

21. A switching power converter circuit comprising:
a first capacitor having a first terminal and a second terminal;
a second capacitor having a first terminal and a second terminal, wherein the first terminal of the second capacitor is coupled to the first terminal of the first capacitor;
a bipolar transistor having a base, a collector, and an emitter, wherein the collector is coupled to the second terminal of the second capacitor, and wherein the base is coupled to the second terminal of the first capacitor;
a diode having an anode and a cathode, wherein the anode is coupled to one of the collector and the emitter of the bipolar transistor, and wherein the cathode is coupled to the other of the collector and the emitter of the bipolar transistor;

a first inductor having a first terminal and a second terminal, wherein the first terminal of the first inductor is coupled to the collector of the bipolar transistor; and a second inductor having a first terminal and a second terminal, wherein the first terminal of the second inductor is coupled to the base of the bipolar transistor.

22. The switching power converter circuit of claim 21, wherein the bipolar transistor is a PNP bipolar transistor, wherein the anode of the diode is coupled to the emitter of the bipolar transistor, and wherein the cathode of the diode is coupled to the collector of the bipolar transistor.

23. The switching power converter circuit of claim 21, wherein the bipolar transistor is an NPN bipolar transistor, wherein the anode of the diode is coupled to the collector of the bipolar transistor, and wherein the cathode of the diode is coupled to the emitter of the bipolar transistor.

24. A switching power converter circuit comprising:

a first capacitor having a first terminal and a second terminal;

a second capacitor having a first terminal and a second terminal, wherein the first terminal of the second capacitor is coupled to the first terminal of the first capacitor;

a bipolar transistor having a base, a collector, and an emitter, wherein the collector is coupled to the second terminal of the second capacitor, and wherein the base is coupled to the second terminal of the first capacitor;

a diode having an anode and a cathode, wherein the anode is coupled to one of the collector and the emitter of the bipolar transistor, and wherein the cathode is coupled to the other of the collector and the emitter of the bipolar transistor;

a first inductor having a first terminal and a second terminal, wherein the first terminal of the first inductor is coupled to the collector of the bipolar transistor; and a second inductor having a first terminal and a second terminal, wherein the first terminal of the second inductor is coupled to the base of the bipolar transistor, and wherein the second terminal of the first inductor is coupled to the second terminal of the second inductor.

\* \* \* \* \*